(12) United States Patent
Sankararaman

(10) Patent No.: US 10,230,183 B2
(45) Date of Patent: Mar. 12, 2019

(54) ELECTRICAL INTERPOSER

(71) Applicant: ROSENBERGER HOCHFREQUENZTECHNIK GMBH & CO. KG, Fridolfing (DE)

(72) Inventor: Sandeep Sankararaman, Vancouver, WA (US)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 15/523,087

(22) PCT Filed: Nov. 3, 2015

(86) PCT No.: PCT/EP2015/002212
§ 371 (c)(1),
(2) Date: Apr. 28, 2017

(87) PCT Pub. No.: WO2016/070992
PCT Pub. Date: May 12, 2016

(65) Prior Publication Data
US 2017/0317438 A1 Nov. 2, 2017

(30) Foreign Application Priority Data
Nov. 6, 2014 (DE) .................... 20 2014 008 844 U

(51) Int. Cl.
*H01R 12/00* (2006.01)
*H01R 12/53* (2011.01)
(Continued)

(52) U.S. Cl.
CPC ........... *H01R 12/53* (2013.01); *H01R 12/526* (2013.01); *H01R 12/55* (2013.01);
(Continued)

(58) Field of Classification Search
CPC ........................... H05K 1/0251; H01R 12/526
See application file for complete search history.

(56) References Cited

U.S. PATENT DOCUMENTS 7,732,913 B2 * 6/2010 Hsieh ................... H05K 1/0251
257/698
8,052,483 B1 11/2011 Straka
(Continued)

FOREIGN PATENT DOCUMENTS

DE 202014009499 U1 1/2015
JP 2002-313498 A 10/2002
(Continued)

*Primary Examiner* — Tho D Ta
(74) *Attorney, Agent, or Firm* — DeLio, Peterson & Curcio, LLC; Robert Curcio

(57) ABSTRACT

The invention relates to an electric interface, in particular an interposer, having a first connection plane with at least one first contact surface pair, each of which has a first and second contact surface, and a second connection plane with at least one second contact surface pair, each of which has a third and a fourth contact surface. For each of a first and second contact surface pair, a first electric connection electrically connects the first contact surface of the first connection plane to the third contact surface of the second connection plane, and a second electric connection electrically connects the second contact surface of the first connection plane to the fourth contact surface of the second connection plane. The first electric connection between the first and third contact surface has a specified first geometric length, and the second electric connection between the second and fourth contact surface has a specified second geometric length, the first and second geometric length being different.

19 Claims, 3 Drawing Sheets

(51) Int. Cl.
  *H01R 12/52* (2011.01)
  *H01R 13/6471* (2011.01)
  *H05K 1/02* (2006.01)
  *H05K 1/11* (2006.01)
  *H01R 12/55* (2011.01)

(52) U.S. Cl.
  CPC ....... *H01R 13/6471* (2013.01); *H05K 1/0245* (2013.01); *H05K 1/0251* (2013.01); *H05K 1/115* (2013.01); *H05K 1/0228* (2013.01); *H05K 2201/10378* (2013.01)

(56) References Cited

U.S. PATENT DOCUMENTS

| | | | |
|---|---|---|---|
| 8,322,031 | B2 | 12/2012 | Chong |
| 8,552,308 | B2 * | 10/2013 | Lee ...................... H05K 1/0245 174/255 |
| 8,766,740 | B2 * | 7/2014 | Hsieh ...................... H04L 25/03 333/28 R |
| 2006/0046537 | A1 | 3/2006 | Chong |
| 2007/0273026 | A1 | 11/2007 | Tien |
| 2012/0243184 | A1 | 9/2012 | Lee |
| 2013/0210289 | A1 | 8/2013 | Schumacher |
| 2013/0272363 | A1 | 10/2013 | Hsieh |

FOREIGN PATENT DOCUMENTS

| | | |
|---|---|---|
| JP | 4387943 B2 | 12/2009 |
| JP | 2010-258390 A | 11/2010 |
| JP | 2011-138775 A | 7/2011 |
| JP | 2012-142245 A | 7/2012 |
| WO | 2008105478 A | 9/2008 |
| WO | 2009119849 A | 10/2009 |

\* cited by examiner

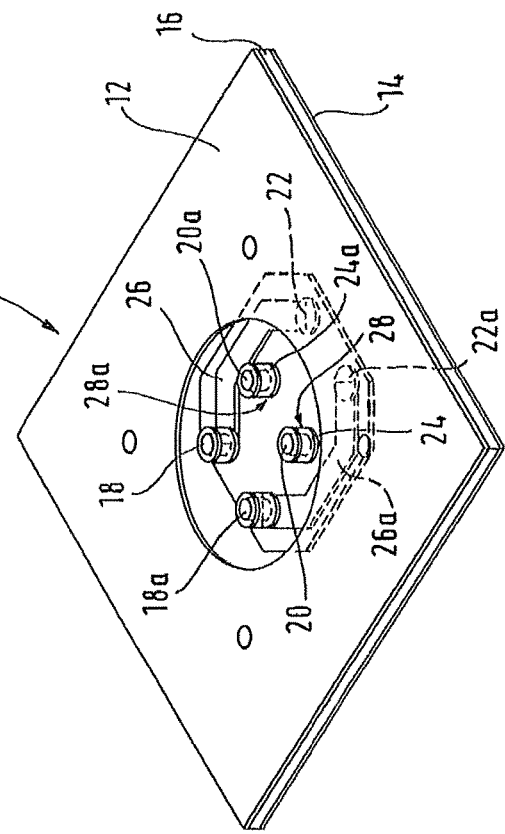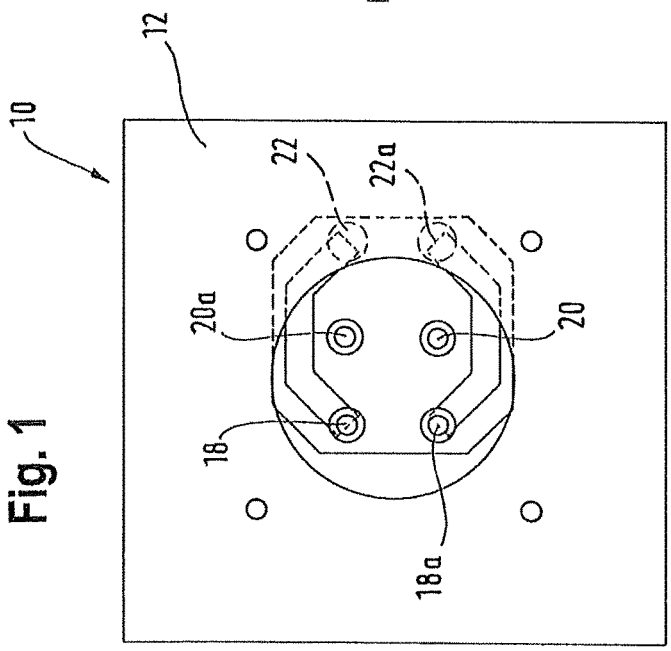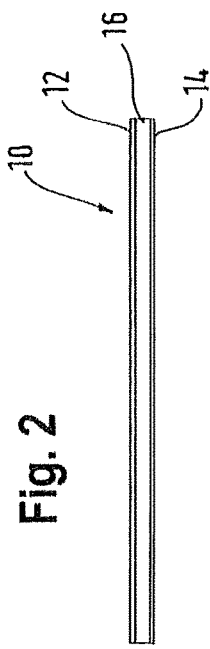

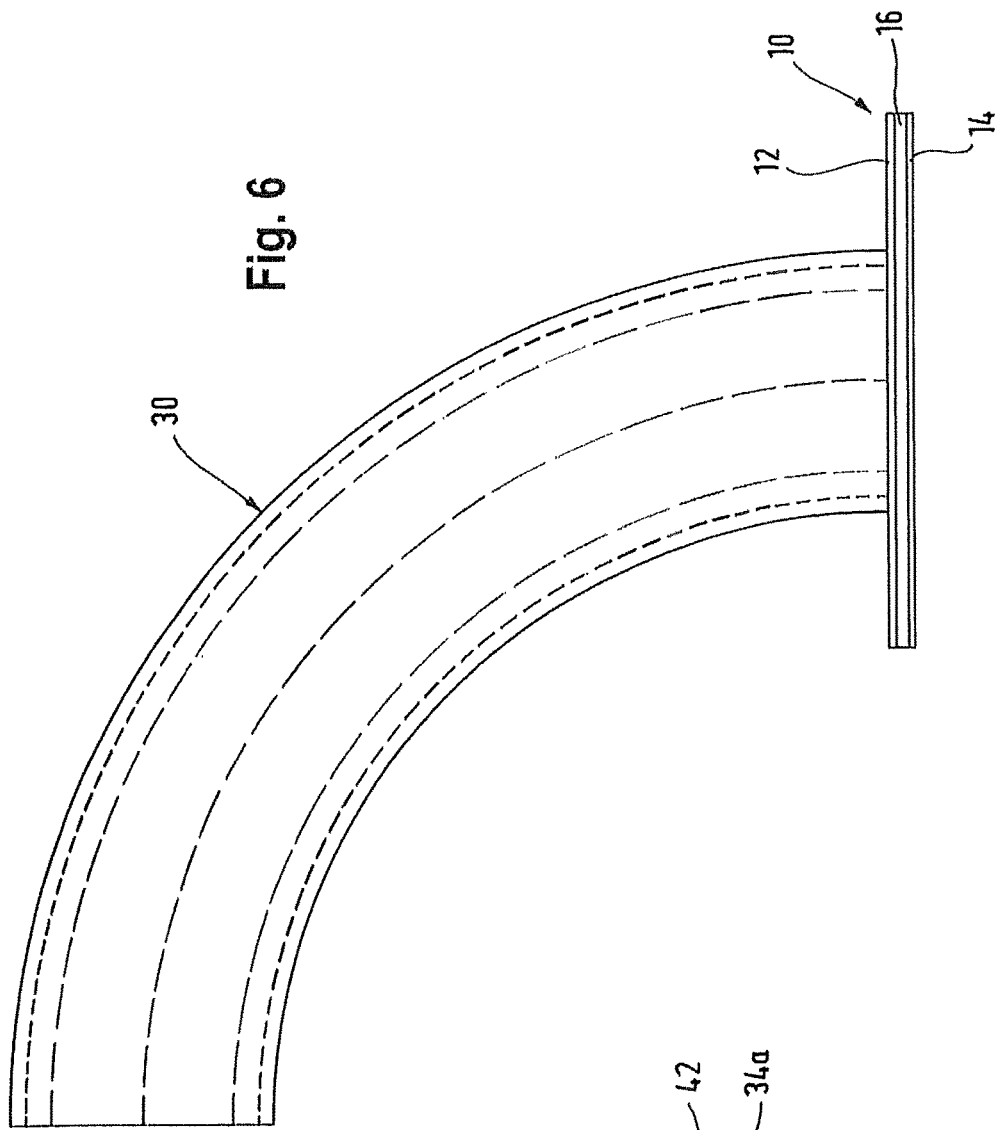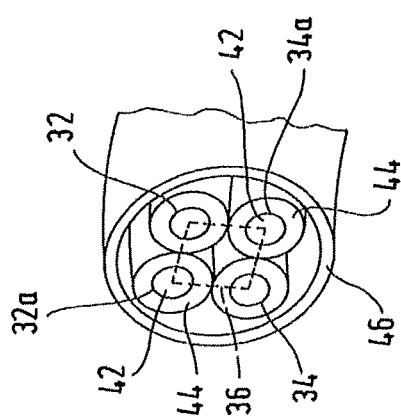

ELECTRICAL INTERPOSER

BACKGROUND OF THE INVENTION

1. Field of the Invention

The present invention relates to an electrical interface, in particular an interposer, comprising a first connection plane with at least one first contact surface pair, each of which comprises a first and second contact surface, and a second connection plane with at least one second contact surface pair, each of which comprises a third and a fourth contact surface, wherein for each of a first and second contact surface pair, a first electric connection electrically connects the first contact surface of the first connection plane to the third contact surface of the second connection plane, and a second electric connection electrically connects the second contact surface of the first connection plane to the fourth contact surface of the second connection plane.

2. Description of Related Art

In large computer systems it is usual that several processor boards, each forming a server, in the form of populated printed circuit boards, also known as "blades", are connected electrically and mechanically via plug-in slots with a so-called "backplane", which is itself also a populated printed circuit board. For this purpose, angle connectors are provided which establish contact between plug connectors or connection points on the blades on the one hand and plug connectors or connection points on the backplane on the other hand in order to establish corresponding data transmission channels between the respective blade and the associated backplane.

However, the electrical connection via the angle connector gives rise to various different problems which affect the high-frequency signal transmission properties of the electrical connections. For example, the conductors in the printed circuit board plug connectors should all have an identical impedance of 85 Ohm.

However, due the geometrical circumstances, not all conductors in an angle plug connector have an identical geometric length, if these are arranged directly on the shortest paths running from the first plane to the second. However, phase differences in the transmission of high-frequency signals via the conductors of the angle connector need to be avoided, for which reason the conductors are frequently laid in a wavelike manner within the angle connectors, so that all conductors have an identical geometric length and thus also electric length. However, this has the disadvantage that the desired characteristic impedance of 85 Ohm is not present at each point between two adjacent conductors due to the distance changing in a wavelike manner. Since the conductors within a printed circuit board plug connector influence one another, for example during the differential transmission of high-frequency signals, this changing characteristic impedance over the course of the conductors leads to significant limitations in terms of the maximum transmittable bandwidth and bit rate.

SUMMARY OF THE INVENTION

The invention is based on the problem of improving an electrical interface of the aforementioned type such that high bandwidths and bit rates are achieved during the transmission of high-frequency signals.

According to the invention, this problem is solved through an electrical interface of the aforementioned type with the characterizing features of the independent claims. Advantageous embodiments of the invention are described in the further claims.

The above and other objects, which will be apparent to those skilled in the art, are achieved in the present invention which is directed to an electrical interface, in particular an interposer, comprising a first connection plane with at least one first contact surface pair, each of which comprises a first and second contact surface, and a second connection plane with at least one second contact surface pair, each of which comprises a third and fourth contact surface, wherein, for each of a first and second contact surface pair, a first electrical connection electrically connects the first contact surface of the first connection plane with the third contact surface of the second connection plane and a second electrical connection electrically connects the second contact surface of the first connection plane with the fourth contact surface of the second connection plane, wherein the first electrical connection between the first and third contact surface has a specified first geometric length and the second electrical connection between the second and fourth contact surface has a specified second geometric length, the first and second geometric lengths being different.

The electrical interface is designed to be interposed between a flat end surface of an electrical angle connector which has at least one conductor pair for the differential transmission of data signals and a connection point with contact surfaces on a printed circuit board.

The electrical interface may include two first and second contact surface pairs, wherein the first and second contact surfaces of the two first contact surface pairs on the first connection plane are arranged at the corners of a square such that a first and second contact surface of a first contact surface pair are in each case arranged diagonally opposite one another, wherein the third and fourth contact surfaces of the two second contact surface pairs on the second connection plane are arranged at the corners of a square such that a third and fourth contact surface of a second contact surface pair are in each case arranged diagonally opposite one another.

All first electrical connections are designed to have an identical geometric length relative to one another and that all second electrical connections have an identical geometric length relative to one another.

The first and second connection plane are preferably arranged parallel to one another.

The second electrical connection may be a through-connection running from the first to the second connection plane in a direction perpendicular to the connection planes. And the second and fourth contact surface of a first and second contact surface pair are arranged so as to align with one another in a direction perpendicular to the connection planes, wherein the first and third contact surface of a first and second contact surface pair are spaced apart from one another in a direction perpendicular to the connection planes.

A third plane may be included, which is arranged between the first and second connection plane, wherein the first electrical connection and the second electrical connection are formed in the third plane. The third plane may be formed parallel to the first and/or second connection plane.

The first electrical connection is designed as a flat conductor track which runs parallel to the first and/or second connection plane.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 shows an exemplary embodiment of an electrical interface according to the invention in a view from above;

FIG. 2 shows the electrical interface according to FIG. 1 in a side view;

FIG. 3 shows the electrical interface according to FIG. 1 in an isometric view;

FIG. 6 shows the electrical interface according to FIG. 1 used with an angle connector; and FIG. 7 shows a detail view of the angle connector according to FIG. 6.

DESCRIPTION OF THE PREFERRED EMBODIMENT(S)

Figure 5:
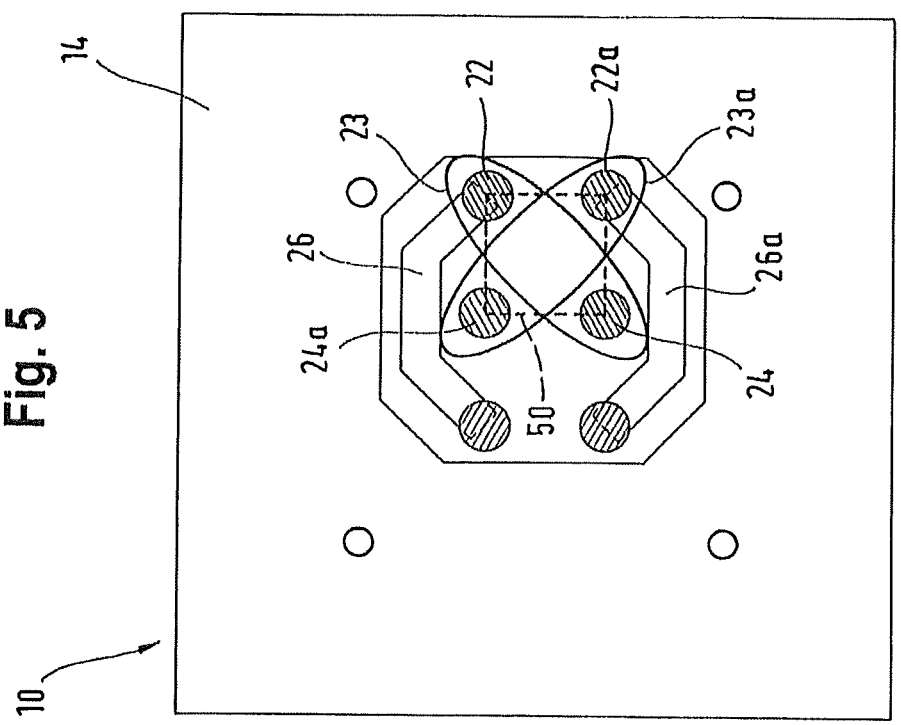
FIG. 5 shows the electrical interface according to FIG. 1 in a view from above, with the upper side omitted, so that only the underside is illustrated from above.

In describing the preferred embodiment of the present invention, reference will be made herein to FIGS. 1-7 of the drawings in which like numerals refer to like features of the invention.

According to the invention, in an electrical interface of the aforementioned type, the first electrical connection between the first and third contact surface has a specified first geometric length and the second electrical connection between the second and fourth contact surface has a specified second geometric length, the first and second geometric length being different.

This has the advantage that, with the electrical interface, runtime or phase differences, for example due to circuits adjacent the electrical interface, between a first electrical signal component which is transmitted via the first and third contact surface and a second electrical signal component which is transmitted via the second and fourth contact surface are deliberately influenced and in particular compensated to a difference of zero.

In order to compensate runtime or phase differences of signals which are transmitted via an electrical angle connector, the electrical interface is designed to be interposed between a flat end surface of an electrical angle connector which has at least one conductor pair for the differential transmission of data signals and a connection point with contact surfaces on a printed circuit board.

An arrangement of the contact surfaces in the manner of a star quad cable, or configured to make contact with end surfaces of a star quad cable, is achieved in that two first and second contact surface pairs are provided, wherein the first and second contact surfaces of the two first contact surface pairs on the first connection plane are arranged at the corners of a square such that a first and second contact surface of a first contact surface pair are in each case arranged diagonally opposite one another, wherein the third and fourth contact surfaces of the two second contact surface pairs on the second connection plane are arranged at the corners of a square such that a third and fourth contact surface of a second contact surface pair are in each case arranged diagonally opposite one another.

An identical compensation of runtime or phase differences for all conductors or contact surface pairs is achieved in that all first electrical connections have an identical geometric length relative to one another and that all second electrical connections have an identical geometric length relative to one another.

An electrical interface requiring little construction space is achieved in that the first and second connection plane are arranged parallel to one another.

A geometric length for the second electrical connection with a value of substantially zero is achieved in that the second electrical connection is a through-connection running from the first to the second connection plane in a direction perpendicular to the connection planes.

A particularly good impedance-controlled electrical interface is achieved in that the second and fourth contact surface of a first and second contact surface pair are arranged so as to align with one another in a direction perpendicular to the connection planes, wherein the first and third contact surface of a first and second contact surface pair are spaced apart from one another in a direction perpendicular to the connection planes.

A particularly electrically and mechanically simple and functionally reliable structure is achieved in that a third plane is formed which is arranged between the first and second connection plane, wherein the first electrical connection and the second electrical connection are formed in the third plane.

A compact structure which can be controlled well electrically, particularly in terms of impedance, is achieved in that the third plane is formed parallel to the first and/or second connection plane.

A particularly simple and electrically functionally reliable runtime or phase difference compensation is achieved in that the first electrical connection is designed as a flat conductor track which runs parallel to the first and/or second connection plane.

The invention is explained as follows with reference to the drawings.

The preferred embodiment of an electrical interface 10 illustrated in FIGS. 1 to 5 has a first connection plane 12, a second connection plane 14 and a third plane 16 which are all oriented parallel to one another, wherein the third plane 16 is arranged between the first and second connection plane 12, 14. Two first contact surface pairs 19, 19a, each with a first contact surface 18, 18a and a second contact surface 20, 20a, are arranged in the first connection plane 12. Two second contact surface pairs 23, 23a, each with a third contact surface 22, 22a and a fourth contact surface 24, 24a, are arranged in the second connection plane 14. In this context the term "plane" means a delimited level or flat surface considered as a two-dimensional object in three-dimensional space. In the exemplary embodiment described in the following, the "planes" 12, 14, 16 are flat (i.e. without curvature), square surfaces.

The first contact surface 18 of one first contact surface pair 19 in the first connection plane 12 is connected electrically with the third contact surface 22 of a second contact surface pair 23 in the second connection plane 14 via a first electrical connection 26. The second contact surface 20 of the first contact surface pair 19 in the first connection plane 12 is connected electrically with the fourth contact surface 24 of a second contact surface pair 23 in the second connection plane 14 via a second electrical connection 28.

The first contact surface 18a of the other first contact surface pair 19a in the first connection plane 12 is connected electrically with the third contact surface 22a of the other second contact surface pair 23a in the second connection plane 14 via a further first electrical connection 26a. The second contact surface 20a of the other first contact surface pair 19a in the first connection plane 12 is connected electrically with the fourth contact surface 24a of the other second contact surface pair 23a in the second connection plane 14 via a further second electrical connection 28a.

In other words, in the interface 10, one first contact surface pair 19 in the first connection plane 12 is transposed to one second contact surface pair 23 in the second connection plane 14 and the other first contact surface pair 19a in the first connection plane 12 is transposed to the other second contact surface pair 23a in the second connection plane 14.

The two first electrical connections 26, 26a are flat conductors which are arranged in the third plane 16 and run substantially parallel to the first and second connection plane 12, 14. The two second electrical connections 28, 28a are through-connections running from the first connection plane 12, through the third plane 16, to the second connection plane 14 and run substantially perpendicular to the three planes 12, 14, 16. The geometric lengths of the first electrical connections 26, 26a are identical and at the same time longer than the geometric lengths of the respective second electrical connections 28, 28a. The geometric lengths of the second electrical connections 28, 28a are also identical to one another.

Figure 4:
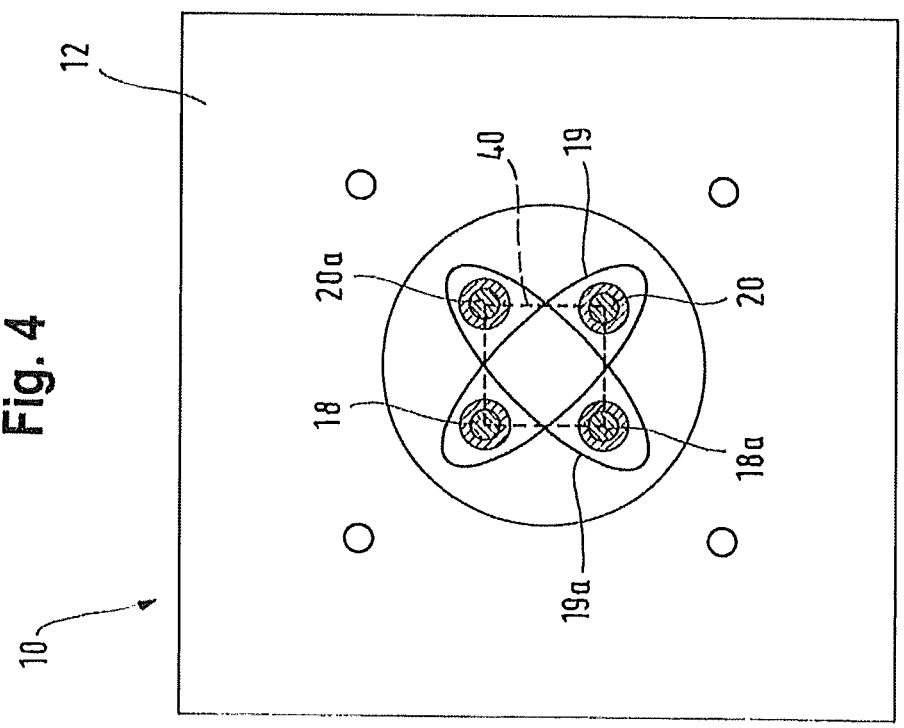
FIG. 4 shows the electrical interface according to FIG. 1 in a view from above, with the underside omitted.

The first and second contact surfaces 18, 18a, 20, 20a in the first connection plane 12 are arranged at the corners of an imaginary square 40 (FIG. 4) in the first connection plane 12 such that the contact surfaces 18, 20 or 18a, 20a of a contact surface pair 19 or 19a are arranged diagonally opposite one another. Thus, in the illustrated embodiment, the first and second contact surface 18, 20 of one first contact surface pair 19 are arranged diagonally opposite one another in relation to the imaginary square 40 (FIG. 4) and the first and second contact surface 18a, 20a of the other first contact surface pair 19a are arranged diagonally opposite one another in relation to the imaginary square 40 (FIG. 4).

Analogously, in the second connection plane 14 the third and fourth contact surfaces 22, 24 or 22a, 24a of the second contact surface pairs 23 or 23a are arranged diagonally opposite one another at the corners of an imaginary square 50 (FIG. 5) in the second connection plane 14. Thus, in the illustrated embodiment the third and fourth contact surface 22, 24 of a second contact surface pair 23 are arranged diagonally opposite one another in relation to the imaginary square 50 (FIG. 5) and the third and fourth contact surface 22a, 24a of the other second contact surface pair 23a are arranged diagonally opposite one another in relation to the imaginary square 50 (FIG. 5).

The arrangement or the so-called "footprint" of the first and second contact surfaces 18, 20 and 18a, 20a in the first connection plane 12 described above is transposed via the invented interface 10 to the arrangement or "footprint" of the third and fourth contact surfaces 22, 24 or 22a, 24a in the second connection plane 14 described above with identical dimensions and arrangement, but displaced in a direction perpendicular to the planes 12, 14, 16. At the same time, by means of the first electrical connection 26, 26a providing an electrical connection between a first contact surface 18 and 18a and a third contact surface 22, 22a, the geometric paths and thus the electrical paths for a transmitted high-frequency signal are lengthened in comparison with the second electrical connections 28, 28a between a second contact surface 20, 20a and a fourth contact surface 24, 24a.

The arrangement of the contact surfaces 18/20, 18a/20a, 22/24, 22a/24a of the contact surface pairs 19, 19a, 23, 23a corresponds to the arrangement of conductors in a so-called star quad transmission cable, which is in particular suitable for the differential transmission of high-frequency signals. The interface according to the invention hereby serves as an interposer between an angle connector 30, as illustrated in FIG. 6, and a printed circuit board (not illustrated). As can be seen from FIG. 7, the angle connector illustrated in FIG. 6 contains two pairs of conductors 32, 34 and 32a, 34a, which are arranged in the manner of a star quad cable, wherein in each cross section of the angle connector 30 the conductors are arranged at the corners of an imaginary square 36, wherein two conductors 32, 34 or 32a, 34a of a conductor pair are always arranged diagonally opposite one another in relation to the imaginary square 36. In other words, on the one hand the conductors 32, 34 are arranged diagonally opposite one another in relation to the imaginary square 36 and on the other hand the conductors 32a, 34a are arranged diagonally opposite one another in relation to the imaginary square 36.

The angle connector 30 shown in FIG. 6 has an angle of 90°, so that the conductors 34, 34a have a shorter geometric length, from one end to the other end of the angle connector 30, than the conductors 32, 32a, since the conductors 34, 34a run along an inside track and the conductors 32, 32a run along an outside track around the goo angle of the angle connector 30. The interface 10 is arranged, as a so-called interposer, between the angle connector 30 and the (not illustrated) printed circuit board such that the conductors 34, 34a with the shorter geometrical paths in the angle connector 30 each meet on the two first contact surfaces 18 and 18a in the first connection plane 12, so that one first contact surface 18 makes electrical contact with the conductor 34 and the other first contact surface 18a makes electrical contact with the conductor 34a.

At the same time, the conductor 32 makes electrical contact with one second contact surface 20 and the conductor 32a makes electrical contact with the other second contact surface 20a in the first connection plane 12. While the electrical signals transmitted via the conductors 32 and 32a are transmitted directly from the second contact surfaces 20, 20a by means of the through-connections 28, 28a, by the shortest path through the interface 10, to the fourth contact surfaces 24, 24a in the second connection plane 14, the signals transmitted from the conductors 34, 34a are transmitted via the long first electrical connections 26, 26a to the third contact surfaces 22, 22a. The first electrical conductors 26, 26a are thereby so designed in terms of their geometric length that a phase or runtime shift relative to the signals transmitted on the other conductors 32, 32a is compensated. In other words, a phase or runtime shift between the geometrically shorter conductors 34, 34a in the angle connector 30 relative to the geometrically longer conductors 32, 32a in the angle connector 30 is compensated by means of the first electrical connection 26, 26a. The compensation in each case takes place for a conductor pair 32, 34 or 32a, 34a arranged diagonally opposite one another in the angle connector 30, so that the phase or runtime shift of a signal in the conductor 34 relative to the conductor 32 is compensated through one first electrical connection 26 and the phase or runtime shift of a signal in the conductor 34a relative to the conductor 32a is compensated through the other first electrical connection 26a.

Each conductor 32, 34, 32a and 34a has a copper wire 42 with a diameter of for example 0.3 mm as well as a coating 44, for example made of Teflon. The four conductors 32, 34, 32a and 34a are embedded in a dielectric 46, which for example has a diameter of 1.7 mm. The dielectric is for example manufactured from the material polyoxymethylene (abbreviation: POM).

The connection planes 12, 14 are for example manufactured from an epoxy resin laminate with the designation NELCO® N4000-13 and have a thickness of for example 4 mm.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electrical interface, in particular an interposer, comprising a first connection plane with at least one first contact surface pair, each of which comprises a first and second contact surface, and a second connection plane with at least one second contact surface pair, each of which comprises a third and fourth contact surface, wherein, for a first and second contact surface pair of said at least one first and second contact surface pairs, a first electrical connection electrically connects the first contact surface of the first connection plane with the third contact surface of the second connection plane and a second electrical connection electrically connects the second contact surface of the first connection plane with the fourth contact surface of the second connection plane, wherein the first electrical connection between the first and third contact surface has a specified first geometric length and the second electrical connection between the second and fourth contact surface has a specified second geometric length, the first and second geometric lengths being different, wherein the first and second contact surfaces of the two first contact surface pairs on the first connection plane are arranged at the corners of a square such that a first and second contact surface of a first contact surface pair are in each case arranged diagonally opposite one another, wherein the third and fourth contact surfaces of the two second contact surface pairs on the second connection plane are arranged at the corners of a square such that a third and fourth contact surface of a second contact surface pair are in each case arranged diagonally opposite one another.

2. The electrical interface of claim 1, wherein the first electrical connection is designed as a flat conductor track which runs parallel to the first and/or second connection plane.

3. The electrical interface of claim 1, wherein the first and second connection plane are arranged parallel to one another.

4. The electrical interface of claim 3, wherein the second and fourth contact surface of a first and second contact surface pair are arranged so as to align with one another in a direction perpendicular to the connection planes, wherein the first and third contact surface of a first and second contact surface pair are spaced apart from one another in a direction perpendicular to the connection planes.

5. The electrical interface of claim 1, including a third plane which is arranged between the first and second connection plane, wherein the first electrical connection and the second electrical connection are formed in the third plane.

6. The electrical interface of claim 5, wherein the third plane is formed parallel to the first and/or second connection plane.

7. The electrical interface of claim 1, wherein the electrical interface is designed to be interposed between a flat end surface of an electrical angle connector which has at least one conductor pair for the differential transmission of data signals and a connection point with contact surfaces on a printed circuit board.

8. The electrical interface of claim 7, including two first and second contact surface pairs, wherein the first and second contact surfaces of the two first contact surface pairs on the first connection plane are arranged at the corners of a square such that a first and second contact surface of a first contact surface pair are in each case arranged diagonally opposite one another, wherein the third and fourth contact surfaces of the two second contact surface pairs on the second connection plane are arranged at the corners of a square such that a third and fourth contact surface of a second contact surface pair are in each case arranged diagonally opposite one another.

9. The electrical interface of claim 8, wherein all first electrical connections have an identical geometric length relative to one another and that all second electrical connections have an identical geometric length relative to one another.

10. The electrical interface of claim 3, wherein the second electrical connection is a through-connection running from the first to the second connection plane in a direction perpendicular to the connection planes.

11. The electrical interface of claim 10, wherein the second and fourth contact surface of a first and second contact surface pair are arranged so as to align with one another in a direction perpendicular to the connection planes, wherein the first and third contact surface of a first and second contact surface pair are spaced apart from one another in a direction perpendicular to the connection planes.

12. The electrical interface of claim 10, wherein the second and fourth contact surface of a first and second contact surface pair are arranged so as to align with one another in a direction perpendicular to the connection planes, wherein the first and third contact surface of a first and second contact surface pair are spaced apart from one another in a direction perpendicular to the connection planes.

13. The electrical interface of claim 9, wherein the first and second connection plane are arranged parallel to one another.

14. The electrical interface of claim 13, including a third plane which is arranged between the first and second connection plane, wherein the first electrical connection and the second electrical connection are formed in the third plane.

15. The electrical interface of claim 14, wherein the third plane is formed parallel to the first and/or second connection plane.

16. The electrical interface of claim 15, wherein the first electrical connection is designed as a flat conductor track which runs parallel to the first and/or second connection plane.

17. An electrical interface, in particular an interposer, comprising a first connection plane with at least one first contact surface pair, each of which comprises a first and second contact surface, and a second connection plane with at least one second contact surface pair, each of which comprises a third and fourth contact surface, wherein, for a first and second contact surface pair of said at least one first and second contact surface pairs, a first electrical connection electrically connects the first contact surface of the first connection plane with the third contact surface of the second connection plane and a second electrical connection electrically connects the second contact surface of the first connection plane with the fourth contact surface of the second connection plane, wherein the first electrical connection between the first and third contact surface has a specified first geometric length and the second electrical connection between the second and fourth contact surface has a specified second geometric length, the first and second geometric lengths being different, wherein all first electrical connections have an identical geometric length relative to one another and that all second electrical connections have an identical geometric length relative to one another.

18. The electrical interface of claim 17, wherein all first electrical connections have an identical geometric length relative to one another and that all second electrical connections have an identical geometric length relative to one another.

19. The electrical interface of claim 17, wherein the first and second connection plane are arranged parallel to one another.

* * * * *